United States Patent
Okuno et al.

(10) Patent No.: US 8,975,736 B2
(45) Date of Patent: Mar. 10, 2015

(54) WAFER LEVEL PACKAGE, CHIP SIZE PACKAGE DEVICE AND METHOD OF MANUFACTURING WAFER LEVEL PACKAGE

(75) Inventors: Toshiaki Okuno, Shiga (JP); Katsuyuki Inoue, Kyoto (JP); Takeshi Fujiwara, Shiga (JP); Tomonori Seki, Shiga (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/000,111

(22) PCT Filed: Mar. 16, 2011

(86) PCT No.: PCT/JP2011/056237
§ 371 (c)(1),
(2), (4) Date: Sep. 24, 2013

(87) PCT Pub. No.: WO2012/111174
PCT Pub. Date: Aug. 23, 2012

(65) Prior Publication Data
US 2014/0008779 A1 Jan. 9, 2014

(30) Foreign Application Priority Data
Feb. 16, 2011 (JP) ................. 2011-031328

(51) Int. Cl.
*H01L 23/06* (2006.01)
*H01L 21/78* (2006.01)
(Continued)

(52) U.S. Cl.
CPC ............... *H01L 21/78* (2013.01); *H01L 21/50* (2013.01); *H01L 23/10* (2013.01); *B81C 1/00873* (2013.01); *B81C 1/00269* (2013.01); *H01L 2924/0002* (2013.01); *B81C 2203/019* (2013.01)
USPC ........................................................ 257/684

(58) Field of Classification Search
CPC ........... H01L 2924/01078; H01L 2924/01079; H01L 2924/15311; H01L 2924/0657; H01L 25/0657; H01L 25/105; H01L 2224/48091
USPC ......... 257/684–686, 688, 693, 774, 777, 775, 257/786
See application file for complete search history.

(56) References Cited

U.S. PATENT DOCUMENTS 5,448,014 A    9/1995  Kong et al.
(Continued)

FOREIGN PATENT DOCUMENTS

JP            06-318625 A    11/1994
(Continued)

OTHER PUBLICATIONS

International Search Report in corresponding International Application No. PCT/JP2011/056237 mailed Apr. 12, 2011 (2 pages).

*Primary Examiner* — Hoa B Trinh
(74) *Attorney, Agent, or Firm* — Osha Liang LLP

(57) ABSTRACT

A wafer level package has a first wafer having a plurality of chips mounted or formed thereon in a plane, and a second wafer that is opposed to the first wafer. The first wafer and the second wafer are joined while a seal frame that seals a periphery of each chip is interposed therebetween. A gap is formed between the seal frames of the chips adjacent to each other. A partial connect part that partially connects the seal frames to each other is provided in the gap formed between the seal frames of the chips adjacent to each other.

20 Claims, 9 Drawing Sheets

(51) Int. Cl.
   *H01L 21/50*   (2006.01)
   *H01L 23/10*   (2006.01)
   *B81C 1/00*   (2006.01)

(56) References Cited

U.S. PATENT DOCUMENTS 8,351,217 B2 * 1/2013 Watanabe .................... 361/783

2003/0116825 A1 6/2003 Geefay et al.
2009/0194861 A1 8/2009 Bonse et al.

FOREIGN PATENT DOCUMENTS

| | | |
|---|---|---|
| JP | 2003-204005 A | 7/2003 |
| JP | 2008-542578 A | 11/2008 |
| JP | 2009-004461 A | 1/2009 |

* cited by examiner

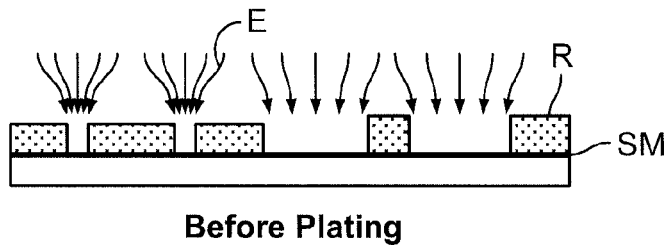
Before Plating
*FIG. 6A*
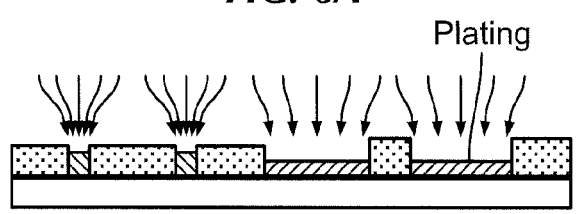
After Plating
*FIG. 6B*
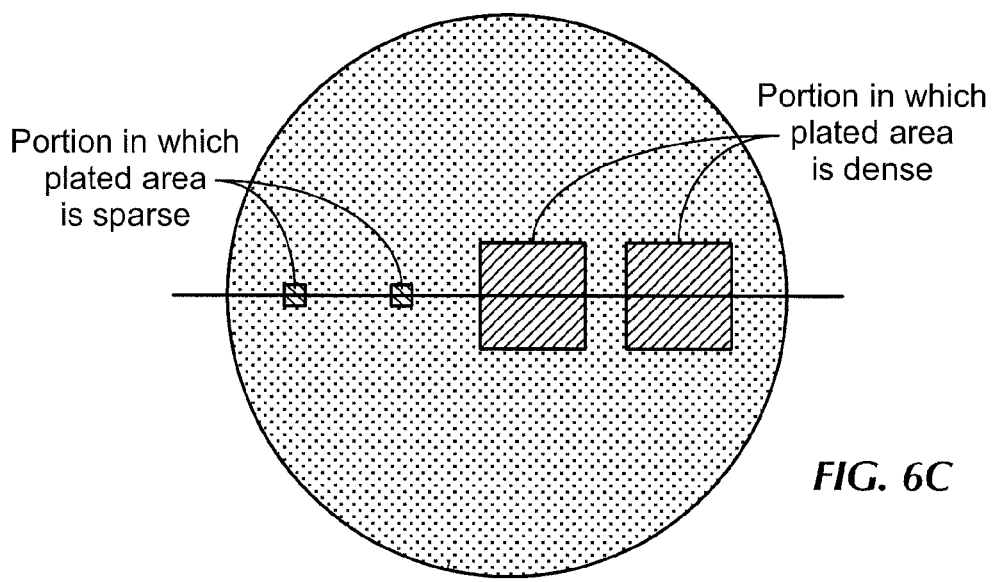
*FIG. 6C*
| Pattern | Sparse | Dense |
|---|---|---|
| Electric flux density | Dense | Sparse |
| Plating deposition rate | Fast | Slow |
*FIG. 6D*

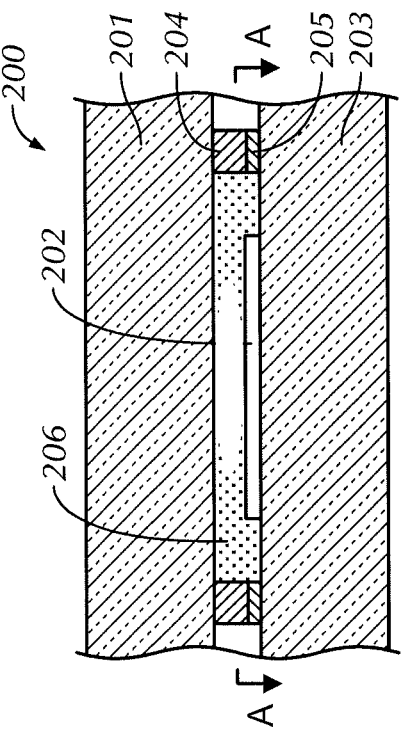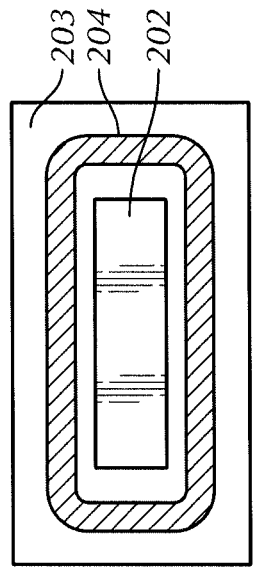
FIG. 12A
FIG. 12B
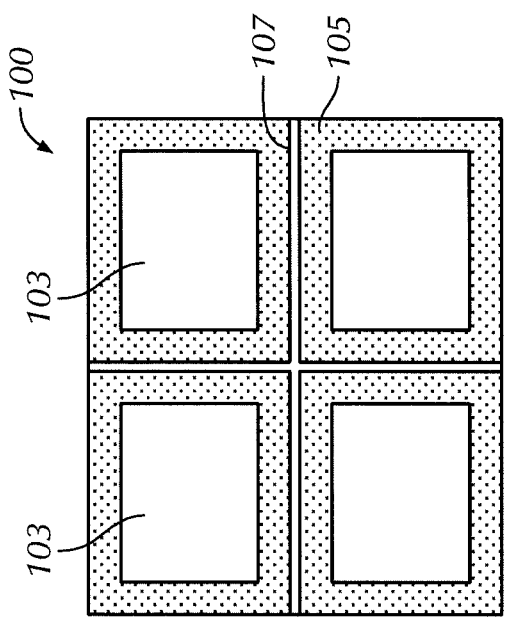
FIG. 11A
FIG. 11B

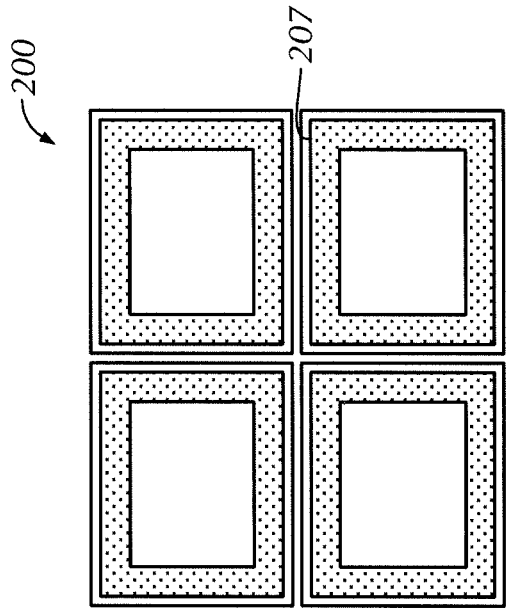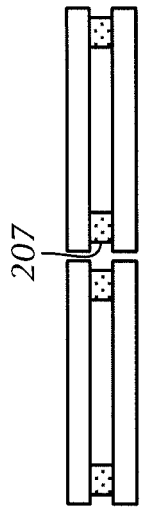
FIG. 14A    FIG. 14B
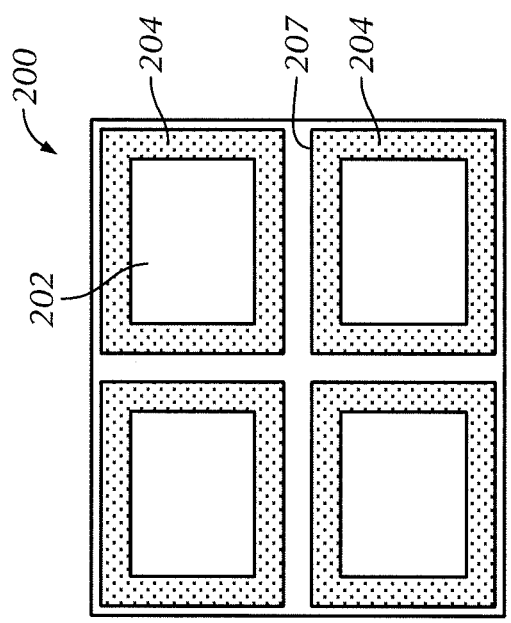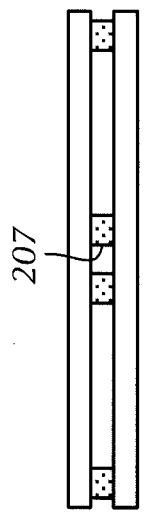
FIG. 13A    FIG. 13B

WAFER LEVEL PACKAGE, CHIP SIZE PACKAGE DEVICE AND METHOD OF MANUFACTURING WAFER LEVEL PACKAGE

BACKGROUND

1. Technical Field

The present invention relates to a wafer level package, a chip size package device, and a wafer level package manufacturing method, in which plural chips are mounted on or formed in a plane of a first wafer and a second wafer is joined to the first wafer to seal each chip using a seal frame. Particularly, the present invention relates to a wafer level package that can avoid generation of a crack in the seal frame during dicing and reduce generation of separation in the wafer even if the wafer is subjected to a high-temperature process after a wet process or liquid cleaning.

2. Related Art

Nowadays, downsizing, weight reduction, and high functionality make dramatic progress in electronic products typified by a mobile phone, a mobile computer, a personal digital assistance (PDA), and a digital still camera (DSC) and the like. With a market trend of the electronic products, there is also a strong demand for the downsizing, a low profile, the weight reduction, and high-density packaging into a mounting board for a semiconductor package mounted on the electronic product.

A new semiconductor package technology called a wafer level package in which processes are performed up to packaging in a wafer state receives attention against this background. In the wafer level package, re-wiring, electrode formation, resin sealing, and dicing are thoroughly performed in the wafer process, a size of the semiconductor chip into which the wafer is finally cut directly becomes a size of the package. Therefore, the wafer level package is ideal technology from the viewpoints of the downsizing and the weight reduction, and is already used in the mobile phone and the like.

Specifically, Patent Documents 1 to 3 disclose conventional technologies for the wafer level package.

In a wafer level package 100 disclosed in Patent Document 1, as illustrated in FIG. 9, a cover wafer 102 including an external electric terminal 101 is disposed on a substrate wafer 104 on which plural semiconductor chips 103 are mounted, each semiconductor chip 103 is sealed with a seal ring 105 that is of a seal frame by joining the cover wafer 102 to the substrate wafer 104, and an electric contact between the external electric terminal 101 of the cover wafer 102 and the semiconductor chips 103 mounted on the substrate wafer 104 is established by a conductive route 106.

In the wafer level package 100, all peripheries of the semiconductor chips 103, . . . are formed by the seal ring 105 as illustrated in FIGS. 10(a) and 10(b), and the seal ring 105 is diced on dicing lines 107 to segmentalize the wafer level package 100 into individual packages as illustrated in FIGS. 11(a) and 11(b).

In a wafer level package 200 disclosed in Patent Document 2, a cap wafer 201 made of silicon (Si) and a base wafer 203 which a device 202 is mounted on or formed in are joined as illustrated in FIGS. 12(a) and 12(b). In the joined portion, a gasket 204 that is of the seal ring formed by partially removing the cap wafer 201 and the base wafer 203 are bonded by a joining material 205, and a spatial portion in the gasket 204 is sealed by a resin 206.

In the wafer level package 200, a gap 207 exists between the gaskets 204 and 204 in the peripheries of the devices 202 adjacent to each other as illustrated in FIGS. 13(a) and 13(b), and the wafer level package 200 is diced in the gap 207 and segmentalized into the individual packages as illustrated in FIGS. 14(a) and 14(b).

The wafer level package disclosed in Patent Document 3 has the configuration similar to that of the wafer level package 200 disclosed in Patent Document 2.

Patent Document 1: Japanese Unexamined Patent Publication No. 6-318625 (Published on Nov. 15, 1994)
Patent Document 2: Japanese Unexamined Patent Publication No. 2003-204005 (Published on Jul. 18, 2003)
Patent Document 3: U.S. Patent Application No. 2009/0194861 (Published on Aug. 6, 2009)

SUMMARY

However, in the conventional wafer level package 100 described in Patent Document 1, because the dicing line 107 exists in the seal ring 105, unfortunately a crack generated during the dicing remains in the seal ring 105, and becomes a degradation factor in a reliability test.

In the conventional wafer level package 200 described in Patent Document 2, the gap 207 exists between the gaskets 204 and 204 adjacent to each other. Because the liquid invades in the gap 207 in a wet process or dipping cleaning in a liquid, unfortunately the liquid such as water is vaporized at once to separate the cap wafer 201 from the base wafer 203 which the device 202 is mounted on or formed in when the wafer level package 200 is subjected to a high-temperature process after the wet process or the liquid cleaning. Accordingly, it may be necessary to bake the wafer level package 200 for a long time at 100° C., which results in lengthened working hours. The same holds true for the wafer level package described in Patent Document 3.

One or more embodiments of the present invention provides a wafer level package, a chip size package device, and a wafer level package manufacturing method, for being able to avoid the generation of the crack in the seal frame during the dicing and reduce the generation of the separation even if the wafer level package is subjected to the high-temperature process after the wet process or the liquid cleaning.

In accordance with one or more embodiments of the present invention, a wafer level package includes: a first wafer of which plural chips are mounted or formed in a plane; and a second wafer that is opposed to the first wafer, wherein the first wafer and the second wafer are joined while a frame-like seal frame that seals a periphery of each chip is interposed therebetween, a gap is formed between the seal frames of the chips adjacent to each other, and a partial connect part that partially connects the seal frames to each other is provided in the gap formed between the seal frames of the chips adjacent to each other.

In accordance with one or more embodiments of the present invention, a chip size package device into which a wafer level package is individualized, a first wafer of which plural chips are mounted or formed in a plane and a second wafer opposed to the first wafer being joined while a frame-like seal frame that seals a periphery of each chip is interposed between the first wafer and the second wafer, wherein a gap is formed between the seal frames of the chips adjacent to each other, a partial connect part that partially connects the seal frames to each other is provided in the gap formed between the seal frames of the chips adjacent to each other, and the chip is individualized by dicing the gap and the partial connect part, after the first wafer and second wafer are joined while the frame-like seal frame that seals a periphery of each chip is interposed therebetween.

In accordance with one or more embodiments of the present invention, a wafer level package manufacturing method for individualizing the wafer level package in which a first wafer of which plural chips are mounted or formed in a plane and a second wafer opposed to the first wafer being joined while a frame-like seal frame that seals a periphery of each chip is interposed between the first wafer and the second wafer, the wafer level package manufacturing method includes: a seal frame forming step of forming a gap between the seal frames of the chips adjacent to each other, and of forming the seal frame such that a partial connect part that partially connects the seal frames to each other is provided in the gap formed between the seal frames of the chips adjacent to each other, and a dicing step of individualizing the chips by dicing the gap and the partial connect part, after the first wafer and second wafer are joined while the frame-like seal frame that seals a periphery of each chip is interposed therebetween.

According to one or more embodiments of the present invention, the gap is formed between the seal frames of the chips adjacent to each other. Therefore, the gap formed between the seal frames of the chips adjacent to each other can be diced when the wafer level package is individualized through the dicing process. As a result, the crack is not left in the seal frame because the seal frame is not directly diced.

The gap formed between the seal frames of the chips adjacent to each other is closed by the partial connect part. Therefore, the liquid such as water does not invade from the outside even in the state in which the first wafer and the second wafer are joined with the seal frame interposed therebetween. As a result, in the state in which the first wafer and the second wafer are joined with the seal frame interposed therebetween, the joined wafer separation caused by the vaporization of the liquid at once is not generated even if the wafer level package is subjected to the high-temperature process after the wet process or the liquid cleaning is performed.

Accordingly, one or more embodiments of the present invention can provide the wafer level package, the chip size package device, and the wafer level package manufacturing method, for being able to avoid the generation of the crack in the seal frame during the dicing and reduce the generation of the separation even if the wafer level package is subjected to the high-temperature process after the wet process or the liquid cleaning.

In the wafer level package according to one or more embodiments of the present invention, as described above, the gap is formed between the seal frames of the chips adjacent to each other, and the partial connect part that partially connects the seal frames to each other is provided in the gap formed between the seal frames of the chips adjacent to each other.

In the chip size package device according to one or more embodiments of the present invention, as described above, the gap is formed between the seal frames of the chips adjacent to each other, the partial connect part that partially connects the seal frames to each other is provided in the gap formed between the seal frames of the chips adjacent to each other, and the wafer level package is individualized by dicing the gap and the partial connect part, after the first wafer and the second wafer are joined while the frame-like seal frame that seals a periphery of each chip is interposed therebetween.

As described above, the wafer level package manufacturing method according to one or more embodiments of the present invention includes the seal frame forming step of forming the gap between the seal frames of the chips adjacent to each other, and of forming the seal frame such that the partial connect part that partially connects the seal frames to each other is provided in the gap formed between the seal frames of the chips adjacent to each other, and the dicing step of individualizing the chip by dicing the gap and the partial connect part, after the first wafer and second wafer are joined while the frame-like seal frame that seals a periphery of each chip is interposed therebetween.

Therefore, one or more embodiments of the present invention can advantageously provide the wafer level package, the chip size package device, and the wafer level package manufacturing method, for being able to avoid the generation of the crack in the seal frame during the dicing and reduce the generation of the separation even if the wafer level package is subjected to the high-temperature process after the wet process or the liquid cleaning.

BRIEF DESCRIPTION OF THE DRAWINGS

FIG. 6(a) is a sectional view illustrating a configuration of a wafer before plating, FIG. 6(b) is a sectional view illustrating the configuration of the wafer after the plating, FIG. 6(c) is a plan view illustrating a wafer pattern, and FIG. 6(d) is a view illustrating a relationship between an electric flux density and a plating deposition rate when the wafer pattern is sparse or dense.

FIG. 11(a) is a plan view illustrating the configuration of the main part of a dicing line in the conventional wafer level package, and FIG. 11(b) is a front view illustrating the configuration of the main part of the wafer level package.

FIG. 12(a) is a sectional view illustrating a configuration of another conventional wafer level package, and FIG. 12(b) is a plan view illustrating the configuration of the wafer level package.

FIG. 13(a) is a plan view illustrating the configuration of the main part of another conventional wafer level package, and FIG. 13(b) is a front view illustrating the configuration of the main part of the wafer level package.

FIG. 14(a) is a plan view illustrating the configuration of the main part of a dicing line in another conventional wafer level package, and FIG. 14(b) is a front view illustrating the configuration of the main part of the wafer level package.

DETAILED DESCRIPTION

One or more embodiments of the present invention will be described below with reference to FIGS. 1 to 6. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1A:
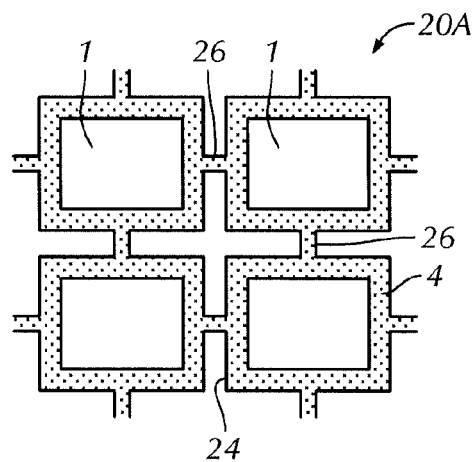
FIG. 1(a) illustrates a wafer level package and a wafer level package manufacturing method according to one or more embodiments of the present invention and is a plan view illustrating a configuration of a main part of the wafer level package.
Figure 1C:
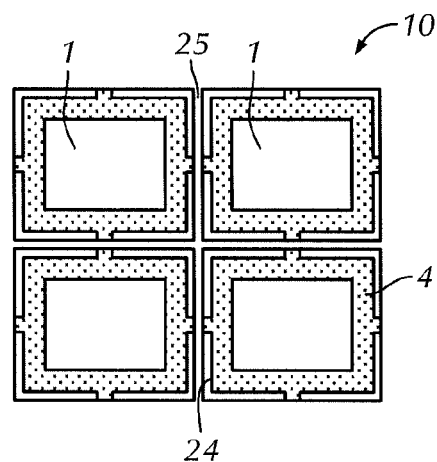
FIG. 1(c) is a plan view illustrating the configuration of the wafer level package after dicing.
Figure 1B:
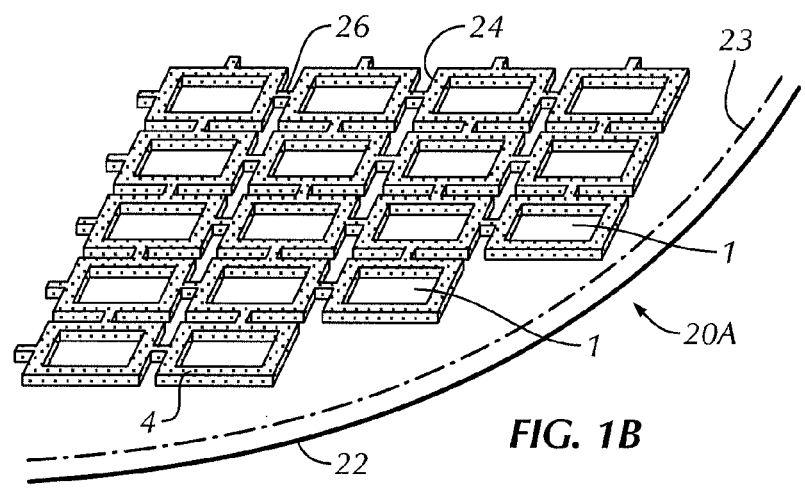
FIG. 1(b) is a perspective view illustrating the configuration of the main part of the wafer level package.
Figure 1D:
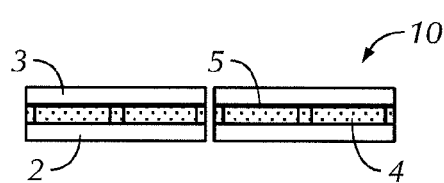
FIG. 1(d) is a front view illustrating the configuration of the wafer level package after the dicing.
Figure 1E:
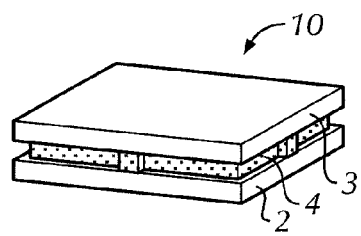
FIG. 1(e) is a perspective view illustrating a configuration of one chip size package device after the dicing.

Structures of an individual chip size package device 10 and a wafer level package 20A, which are manufactured in one or more embodiments of the present invention, will be described with reference to FIGS. 1(a) to 1(e). FIG. 1(a) is a plan view illustrating a configuration of a main part of the wafer level package 20A, FIG. 1(b) is a perspective view illustrating the configuration of a main part of the wafer level package 20A, FIG. 1(c) is a plan view illustrating the wafer level package 20A immediately after dicing with a cover wafer omitted, FIG. 1(d) is a front view illustrating the wafer level package 20A immediately after the dicing, and FIG. 1(e) is a perspective view illustrating a configuration of individualized chip size package device 10. In the description, a joined wafer packaged at a wafer level in a pre-dicing state is referred to as a wafer level package. The wafer level package individualized by the dicing is referred to as a chip size package device.

As illustrated in FIGS. 1(c) to 1(e), in each chip size package device 10 manufactured by a wafer level package manufacturing method of one or more embodiments of the present invention, a base 2 which a semiconductor chip 1 that is of the chip is mounted on or formed in and a cover 3 that covers the base 2 are joined by an bonding agent 5 while a frame-like seal frame 4 that seals a periphery of each semiconductor chip 1 is interposed therebetween.

In one or more embodiments of the present invention, the chip is not limited to the semiconductor chip 1 as long as the chip 1 is a device having a Micro Electro Mechanical System (MEMS) structure or a chip such as an electronic circuit.

As long as the semiconductor chip 1 is sealed, a gap between the semiconductor chip 1 and the seal frame 4 may completely be evacuated or filled with an inert gas or a material such as resin.

Any bonding agent may be used as long as the bonding agent 5 does no damage to the semiconductor chip 1 from the viewpoints of an allowable adhesion property, a sealing power, sealing performance, and an external environment. Accordingly, the bonding agent 5 may be either conductive or non-conductive. In one or more embodiments of the present invention, the bonding agent 5 is disposed or formed between the seal frame 4 and a cover wafer 23. Alternatively, the seal frame 4 may be formed on the side of the cover wafer 23 while the bonding agent 5 is disposed or formed between the seal frame 4 and a base wafer 22 to join the seal frame 4 and the base wafer 22. Alternatively, the bonding agents 5 may be disposed or formed both between the seal frame 4 and the base wafer 22 and between the seal frame 4 and the cover wafer 23. The bonding agent 5 can be applied to not only the case that the seal frame 4 is provided as individual component but also the case that the seal frame 4 is formed by machining from the base wafer 22 or the cover wafer 23. As to the method for disposing or forming the bonding agent 5, the bonding agent 5 can be formed by applying a liquid such as resin, or by evaporating metal.

As illustrated in FIGS. 1(a) and 1(b), the chip size package device 10 is manufactured in the form of the wafer level package 20A. In the wafer level package 20A, the base wafer 22 that is of the first wafer which the plural semiconductor chips 1, . . . are mounted on or formed in plane and the cover wafer 23 that is of the second wafer opposed to the base wafer 22 are joined to each other while the seal frame 4 that seals the periphery of each semiconductor chip 1 is interposed between the base wafer 22 and the cover wafer 23.

The plural semiconductor chips 1 are arrayed while mounted on or formed in the plane of the base wafer 22. Specifically, the plural semiconductor chips 1 are provided into a square lattice shape.

At this point, the base wafer 22 and the cover wafer 23 are made of silicon. However, in one or more embodiments of the present invention, the base wafer 22 and the cover wafer 23 are not limited to the silicon. The base wafer 22 and the cover wafer 23 may be made of glass, ceramic, or other semiconductor materials.

Figure 2:
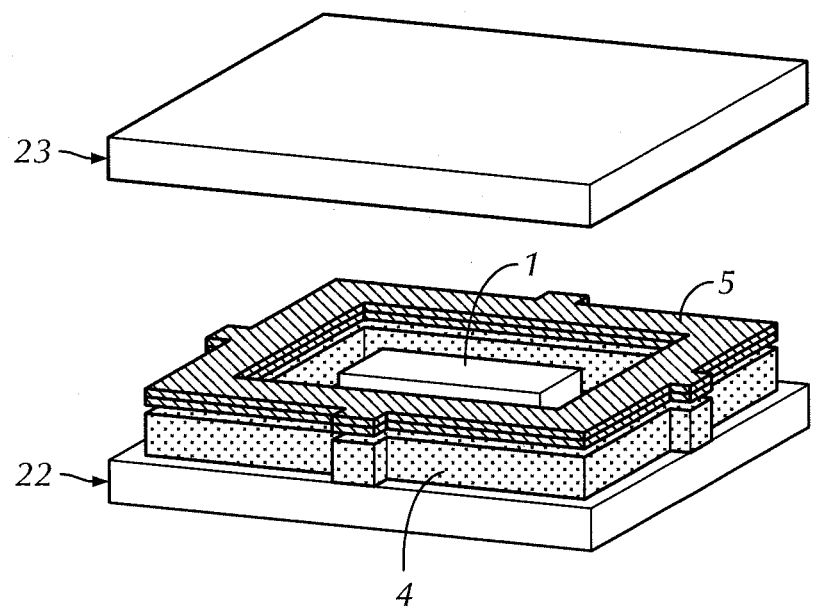
FIG. 2 is an exploded perspective view illustrating the configuration of the wafer level package in which a seal frame is formed by machining from a base wafer.

For example, the seal frame 4 is formed by metal plating using a mold. However, the seal frame 4 is not limited to the metal plating. The seal frame 4 may be made of other materials such as resin. Alternatively, for example, as illustrated in FIG. 2, after a recess portion is formed by machining the surface of the base wafer 22, the seal frame 4 may be formed by depositing metal deposition (such as mold plating) and the bonding agent 5.

In one or more embodiments of the present invention, the seal frame 4 is a square frame. However, any shape may be used as the seal frame 4 as long as the shape can seal the periphery of the semiconductor chip 1. For example, polygonal frames such as a triangle and a pentagon or frames such as a circle and an ellipse may be used.

In one or more embodiments of the present invention, as illustrated in FIG. 1(a), a gap 24 is formed between the seal frames 4 and 4 adjacent to each other. As a result, as illustrated in FIG. 1(c), generation of a crack can be prevented in the seal frame 4 during the dicing by performing the dicing with the substantial center of the gap 24 as a dicing line 25.

In one or more embodiments of the present invention, a partial connect part 26 that partially connects the seal frames 4 and 4 is provided in the gap 24 formed between the seal frames 4 and 4 of the semiconductor chips 1 adjacent to each other. As a result, the gap 24 constitutes a closed space surrounded by the seal frames 4 and 4 and the partial connect part 26.

Therefore, a liquid such as water does not invade from the outside even in the state in which the base wafer 22 and the cover wafer 23 are joined with the seal frame 4 interposed therebetween. As a result, in the state in which the base wafer 22 and the cover wafer 23 are joined with the seal frame 4 interposed therebetween, the separation of the joined base wafer 22 and cover wafer 23, which is caused by the vaporization of the liquid at once, is not generated even if the wafer level package is subjected to the high-temperature process at 100° C. or more after the wet process or the liquid cleaning is performed.

Accordingly, the wafer level package 20A, in which the generation of the crack in the seal frame 4 is avoided during the dicing and the generation of the separation is reduced even if the wafer level package is subjected to the high-temperature process after the wet process or the liquid cleaning, can be provided.

At this point, in the wafer level package 20A according to one or more embodiments of the invention, as illustrated in FIG. 1(a), in the case that the plural semiconductor chips 1 are arrayed while mounted on or formed in the plane of the base wafer 22, the partial connect part 26 is provided in a center portion on opposed sides of the seal frames 4 opposed to each other.

Generally, in the device in which different materials are stacked, a stress is generated by a difference in thermal expansion coefficient during a temperature change. The stress increases with distance from the center of the device. Therefore, in the case that the partial connect part 26 is located closest to the center of the device, namely, in the case that the plural semiconductor chips 1 is arrayed while mounted on or formed in the plane of the base wafer 22, the partial connect part 26 is disposed in the center portion in each of an x-direction and a y-direction of the seal frame 4, thereby obtaining the best environment resistance.

On this point, in one or more embodiments of the present invention, the partial connect part 26 is provided at the position where the thermal stress is minimized during the thermal expansion because the partial connect part 26 is provided in the center portion on the opposed sides of the seal frames 4 opposed to each other. Accordingly, a possibility that the partial connect part 26 is destroyed becomes the minimum during the thermal expansion.

In the case that the seal frames 4 are formed by the mold plating like one or more embodiments of the present invention, the partial connect part 26 is provided in the center portion on the opposed sides of the seal frames 4 opposed to each other, thereby equalizing an area ratio of each partial connect part 26. This is because the formation of the partial connect part 26 in the center portion on the opposed sides of the seal frames 4 equalizes the plating deposition rate in the plane in the case that the seal frames 4 are formed by the mold plating. As a result, a variation in plating thickness decreases to be able to stabilize run-around of the sealing material between the joined surfaces.

Figure 3:
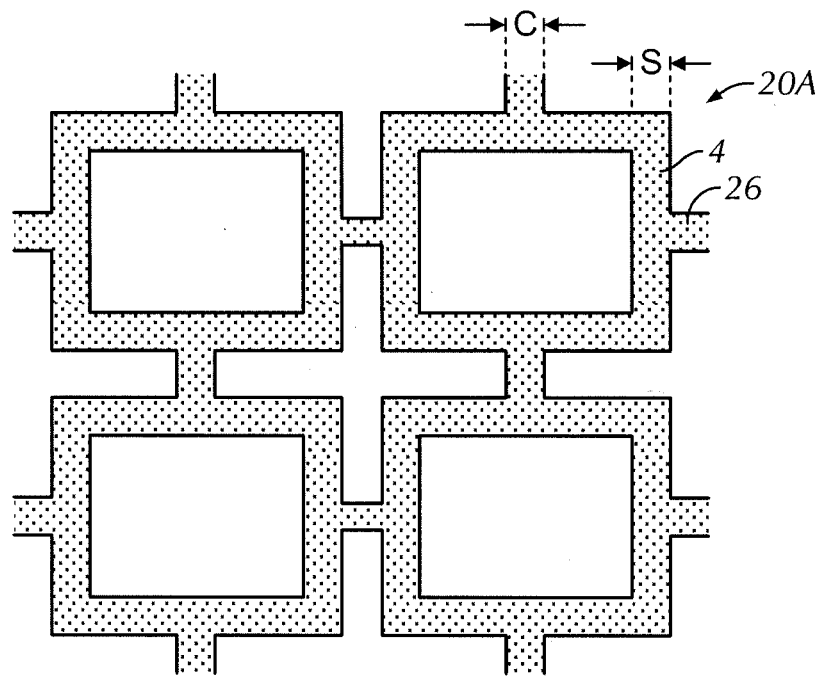
FIG. 3 is a plan view illustrating a configuration of a wafer level package according to a modification and is a plan view illustrating a configuration of a main part of the wafer level package.

At this point, in the wafer level package 20A of one or more embodiments of the present invention, as illustrated in FIG. 3, a pattern width C that is of a width of the partial connect part 26 is equalized to a pattern width S that is of a width of the seal frame 4.

That is, the joined surfaces of the base wafer 22 and the cover wafer 23, particularly the joined surfaces of the seal frame 4 and the cover wafer 23 are bonded using the bonding agent 5, the bonding agent 5 moves to the wider pattern width by an influence of a surface tension when spreading onto the joined surface while the pattern width C of the partial connect part 26 differs from the pattern width S of the seal frame 4.

Figure 4A:
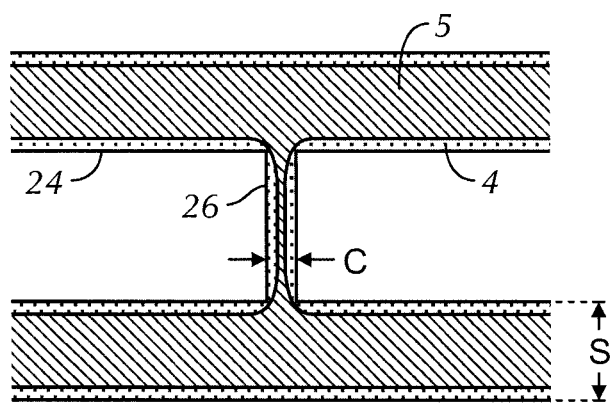
FIG. 4(a) is a plan view illustrating bonding agent wet regions of the seal frame and a partial connect part when a width of the partial connect part is decreased in the wafer level package.

Specifically, as illustrated in FIG. 4(a), in the case that the pattern width C of the partial connect part 26 is less than the pattern width S of the seal frame 4, the bonding agent 5 applied to the partial connect part 26 moves onto the side of the seal frame 4 to reduce a wet area of the bonding agent 5 in the partial connect part 26. Therefore, there is a risk of easily destroying the sealing performance of the partial connect part 26.

Figure 4B:
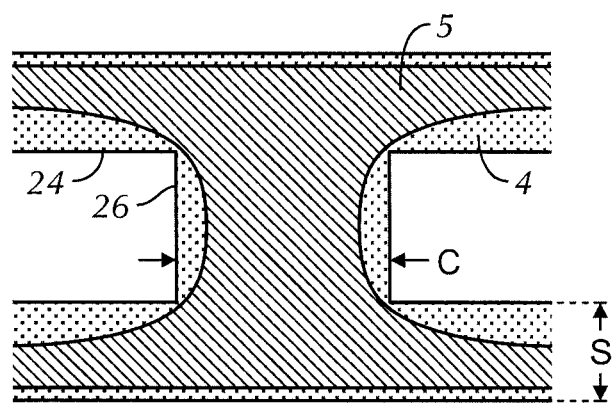
FIG. 4(b) is a plan view illustrating the bonding agent wet regions of the seal frame and the partial connect part when the width of the partial connect part is increased in the wafer level package.

On the other hand, as illustrated in FIG. 4(b), in the case that the pattern width C of the partial connect part 26 is greater than the pattern width S of the seal frame 4, the bonding agent 5 applied to the seal frame 4 moves onto the side of the partial connect part 26 to reduce the wet area of the bonding agent 5 in the seal frame 4. As a result, there is a risk that the sealing performance of the seal frame 4 becomes insufficient.

When the pattern width C of the partial connect part 26 is equalized to the pattern width S of the seal frame 4, base wafer 22 and the cover wafer 23 are joined while the bonding agent 5 spreads stably to both the partial connect part 26 and the seal frame 4.

In the case that the seal frame 4 is formed by the mold plating, the pattern width C of the partial connect part 26 is equalized to the pattern width S of the seal frame 4 to equalize the plating deposition rate in the plane. As a result, the variation in plating thickness decreases to be able to stabilize the run-around of the sealing material between the joined surfaces, namely, the bonding agent 5 that performs the sealing by spreading between the seal frame 4 and the cover side bonded to the seal frame 4.

Figure 5:
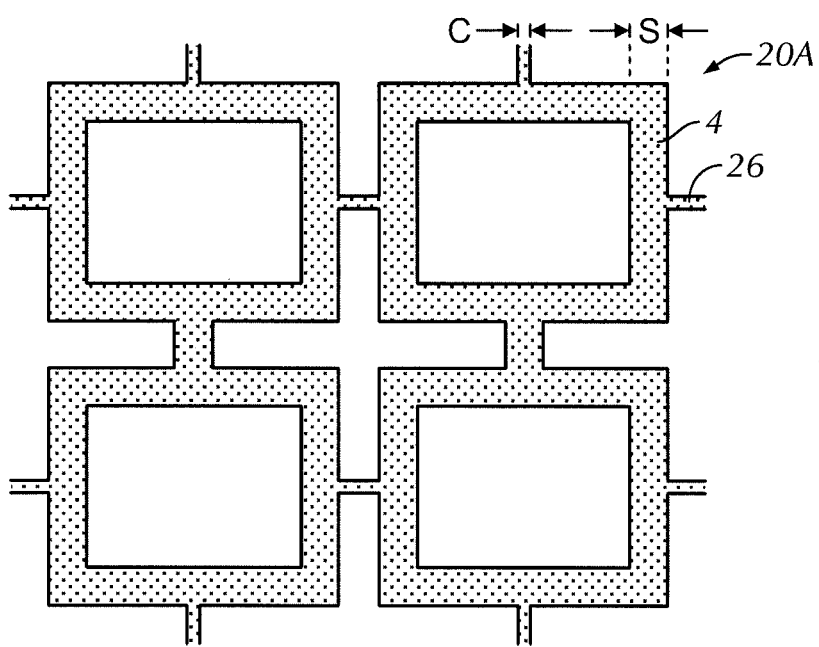
FIG. 5 is a plan view illustrating a configuration of a main part of a wafer level package according to another modification.

In the wafer level package 20A of one or more embodiments of the present invention, as illustrated in FIG. 5, the pattern width C of the partial connect part 26 is greater than or equal to 1 μm.

The one partial connect part 26 is provided in the side surface of each seal frame 4, and the pattern width C of the partial connect part 26 is narrowed as much as possible within the range where the partial connect part 26 can stably be joined. Therefore, a length of the joined portion to be diced can be shortened. Therefore, the crack, which is generated in the joined portion during the dicing, can be reduced to the minimum to ensure high reliability.

From this viewpoint, according to one or more embodiments of the present invention, the minimum value of the pattern width C of the partial connect part 26 is greater than or equal to 1 μm in consideration of the partial connect part 26 that can be formed by etching and a restriction to alignment accuracy during the joining.

A method for manufacturing the wafer level package 20A of one or more embodiments of the present invention will be described below.

As illustrated in FIGS. 1(a) and 1(b), the plural semiconductor chips 1 are arrayed while mounted on or formed in the plane of the base wafer 22. Then, in a seal frame forming process that is of the seal frame forming step, the frame-like seal frame 4 that seals the periphery of each semiconductor chip 1 is formed by the mold plating. At this point, the gap 24 is formed between the seal frames 4 of the semiconductor chips 1. The seal frame 4 including the partial connect part 26 that partially connects the seal frames 4 and 4 is formed in the gap 24. Then, as illustrated in FIGS. 1(b) and 1(d), the bonding agent 5 is disposed or formed in the seal frame 4, and the cover wafer 23 covers the seal frame 4 after the alignment. Then, as illustrated in FIGS. 1(c) and 1(d), through the dicing process, the gap 24 between the seal frames 4 and 4 is diced on the dicing line 25 to individualize the wafer level package 20A. Therefore, the chip size package device 10 individualized into each package is completed as illustrated in FIG. 1(e).

The wafer level package 20A of one or more embodiments of the present invention includes the base wafer 22 of which the plural semiconductor chips 1 are mounted on or formed in the plane and the cover wafer 23 opposed to the base wafer 22, and the base wafer 22 and the cover wafer 23 are joined while the frame-like seal frame 4 that seals the periphery of each semiconductor chip 1 is interposed therebetween. The gap 24 is formed between the seal frames 4 of the semiconductor chips 1 adjacent to each other, and the partial connect part 26 that partially connects the seal frames 4 to each other is provided in the gap 24 formed between the seal frames 4 of the semiconductor chips 1 adjacent to each other.

Therefore, the gap 24 formed between the seal frames 4 and 4 of the semiconductor chips 1 adjacent to each other can be diced when the wafer level package is individualized through the dicing process. As a result, the crack is not left in the seal frame 4 because the seal frame 4 is not directly diced.

The gap 24 formed between the seal frames 4 of the semiconductor chips 1 adjacent to each other is closed by the partial connect part 26. As a result, in the state in which the base wafer 22 and the cover wafer 23 are joined with the seal frame 4 interposed therebetween, the joined wafer separation caused by the vaporization of the liquid at once is not generated even if the wafer level package is subjected to the high-temperature process after the wet process or the liquid cleaning is performed.

Accordingly, the wafer level package 20A, in which the generation of the crack in the seal frame 4 is avoided during the dicing and the generation of the separation is reduced even if the wafer level package is subjected to the high-temperature process after the wet process or the liquid cleaning, can be provided.

As to a spillover effect, the number of chip size package devices 10 per wafer increases compared with the case that the protect ring is formed in the outer circumference of the wafer. The wet process, the cleaning, and the high-temperature process can be performed even if the outer circumferential gap is not closed in the state in which the base wafer 22 and the cover wafer 23 are joined.

In the wafer level package 20A of one or more embodiments of the present invention, the plural semiconductor chips 1 are arrayed while mounted on or formed in the plane of the base wafer 22, and the partial connect part 26 is provided in the center portion on the opposed sides of the seal frames 4 opposed to each other.

Because the partial connect part 26 is provided in the place where the thermal stress is minimized during the thermal expansion, the risk of destroying the partial connect part 26 is minimized during the thermal expansion.

In one or more embodiments of the present invention, the partial connect part 26 is provided in the center portion on the opposed sides of the seal frames 4 opposed to each other, thereby locally equalizing the area ratio of the seal frame 4 in the plane of the wafer. Accordingly, as illustrated in FIGS. 6(a) and 6(b), in the case that the seal frame 4 is patterned using a resist mold R and formed by electrolytic plating, the electric flux density is equalized during the electrolytic plating when the partial connect part 26 is formed in the center portion on the opposed sides of the seal frames 4 by the electrolytic plating. As a result, the deposition rate of the electrolytic plating is equalized in the plane of the wafer, and the variation in plating thickness decreases to be able to stabilize the run-around of the sealing material between the joined surfaces. Particularly, as illustrated in FIGS. 6(a) and 6(b), in the electrolytic plating, a metallic ion in a plating solution is attracted to the surface of the base wafer 22 by an electric field, and deposited on the surface. An electric line of force E flows intensively in a place through which a current is passed (a place in which a seed metal SM is exposed while the resist mold R does not exist). As illustrated in FIGS. 6(c) and 6(d), the electric flux density becomes dense in the portion in which the pattern is sparse and the electric flux density becomes sparse in the portion in which the pattern is dense. Therefore, amount of metal deposited per unit area or unit time (the plating deposition rate) varies when the sparse and dense difference exists in the patterns. As described above, in one or more embodiments of the present invention, the partial connect part 26 is provided in the center portion on the opposed sides of the seal frames 4 opposed to each other. Therefore, the area ratio of the seal frame 4 is locally equalized in the plane of the wafer, the deposition rate of the electrolytic plating is equalized in the plane of the wafer, the variation in plating thickness decreases, and the run-around of the sealing material between the joined surfaces can be stabilized.

In the wafer level package 20A of one or more embodiments of the present invention, the pattern width C of the partial connect part 26 can be equalized to the pattern width S of the seal frame 4. Therefore, the base wafer 22 and the cover wafer 23 can be joined while the bonding agent 5 spreads stably onto both the seal frame 4 and the partial connect part 26.

In the case that the seal frame 4 is formed by the mold plating, the variation in plating thickness decreases to be able to stabilize the run-around of the sealing material between the joined surfaces.

In the wafer level package 20A of one or more embodiments of the present invention, the pattern width C of the partial connect part 26 is greater than or equal to 1 µm. Therefore, the crack, which is generated in the joined portion during the dicing, can be reduced to the minimum to ensure the high reliability.

The chip size package device 10 of one or more embodiments of the present invention is formed by individualizing the wafer level package 20A, in which the base wafer 22 of which the plural semiconductor chips 1 are mounted on or formed in the plane and the cover wafer 23 opposed to the base wafer 22 are joined while the frame-like seal frame 4 that seals the periphery of each semiconductor chip 1 is interposed therebetween. The gap 24 is formed between the seal frames 4 and 4 of the semiconductor chips 1 adjacent to each other, the partial connect part 26 that partially connects the seal frames 4 and 4 to each other is formed in the gap 24 formed between the seal frames 4 of the semiconductor chips 1 adjacent to each other, and the wafer level package 20A is individualized by dicing the gap 24 and the partial connect part 26 after the base wafer 22 and the cover wafer 23 are joined while the frame-like seal frame 4 that seals the periphery of each semiconductor chip 1 is interposed therebetween.

The wafer level package 20A, in which the base wafer 22 of which the plural semiconductor chips 1 are mounted on or formed in the plane and the cover wafer 23 opposed to the base wafer 22 are joined while the frame-like seal frame 4 that seals the periphery of each semiconductor chip 1 is interposed therebetween, is individualized in the method for manufacturing the wafer level package 20A of one or more embodiments of the present invention. At this point, the method includes: the seal frame forming process of forming the gap 24 between the seal frames 4 of the semiconductor chips 1 adjacent to each other and of forming the seal frame 4 such that the partial connect part 26 that partially connects the seal frames 4 and 4 to each other is provided in the gap 24 formed between the seal frames 4 of the semiconductor chips 1 adjacent to each other; and the dicing process of individualizing the semiconductor chips 1 by dicing the gap and the partial connect part 26 after the base wafer 22 and the cover wafer 23 are joined while the frame-like seal frame 4 that seals the periphery of each semiconductor chip 1 is interposed therebetween.

Therefore, one or more embodiments of the present invention can provide the wafer level package 20A, the chip size package device 10, and the method for manufacturing the wafer level package 20A, for being able to avoid the generation of the crack in the seal frame 4 during the dicing and reduce the generation of the separation even if the wafer level package is subjected to the high-temperature process after the wet process or the liquid cleaning.

One or more embodiments of the present invention will be described below with reference to FIGS. 7 and 8.

In the wafer level package 20A of one or more embodiments of the present invention, as illustrated in FIG. 1(b), the partial connect part 26 is formed in the seal frame 4 in the periphery of each of all the semiconductor chips 1. On the other hand, in a wafer level package 20B of one or more embodiments of the present invention, as illustrated in FIGS. 7(a), 7(b), and 7(c), the partial connect part 26 is formed only in the seal frame 4 in an outer circumferential portion of the base wafer 22.

Figure 7A:
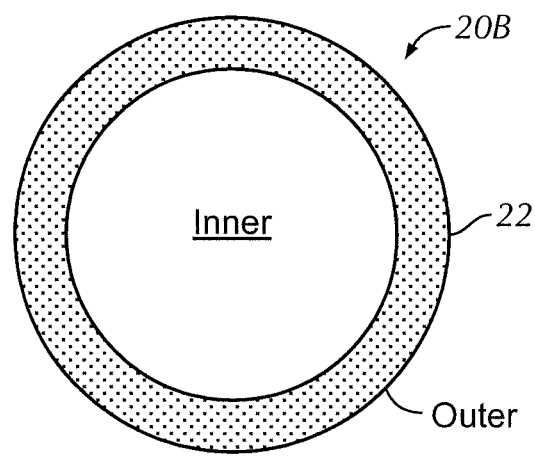
FIG. 7(a) illustrates a configuration of a wafer level package according to still another modification and is a plan view illustrating the configuration of the wafer.
Figure 7B:
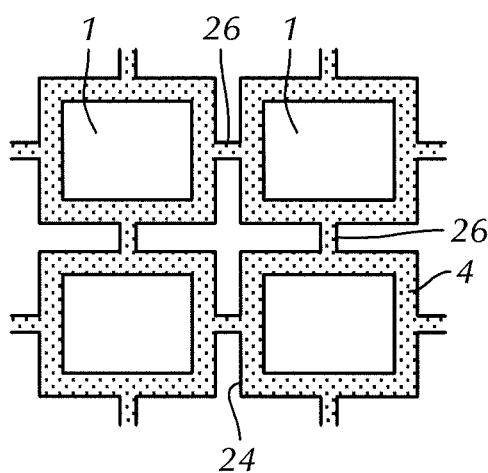
FIG. 7(b) is a plan view illustrating the configuration of the main part in an outer circumferential portion of the wafer level package.
Figure 7C:
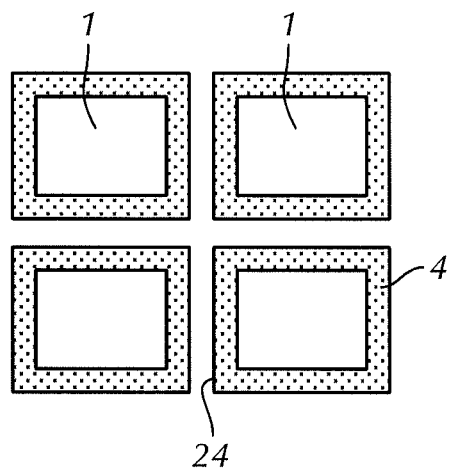
FIG. 7(c) is a plan view illustrating the configuration of the main part in a central portion of the wafer level package.

This is, in the wafer level package 20B of one or more embodiments of the present invention, as illustrated in FIGS. 7(a) and 7(b), the partial connect part 26 is formed in the center of the seal frame 4 of the semiconductor chip 1 that is mounted on or formed in an outer circumferential portion OUTER of the base wafer 22. On the other hand, as illustrated in FIGS. 7(a) and 7(c), the partial connect part 26 is not formed in the seal frame 4 of the semiconductor chip 1 that is mounted on or formed in a central portion INNER of the base wafer 22.

Specifically, according to one or more embodiments of the present invention the seal frame 4 of the semiconductor chip 1 in the outer circumferential portion OUTER of the base wafer 22 includes the seal frames 4 formed in the peripheries of at least the top third semiconductor chips 1 from the outermost circumferential semiconductor chip 1 of the base wafer 22 in both the x-direction and the y-direction.

When the partial connect parts 26 are formed only in the seal frames 4 in the outer circumferential portions OUTER of the base wafer 22 and the cover wafer 23, the partial connect part 26 that traverses the dicing line does not exist in the seal frames 4 in the central portions INNER of the base wafer 22 and the cover wafer 23. Accordingly, the generation of the crack can be reduced in the seal frame 4.

In the above description, the partial connect part 26 formed in the gap 24 of the seal frame 4 exists only in the outer circumferential portion OUTER of the base wafer 22.

Figure 8A:
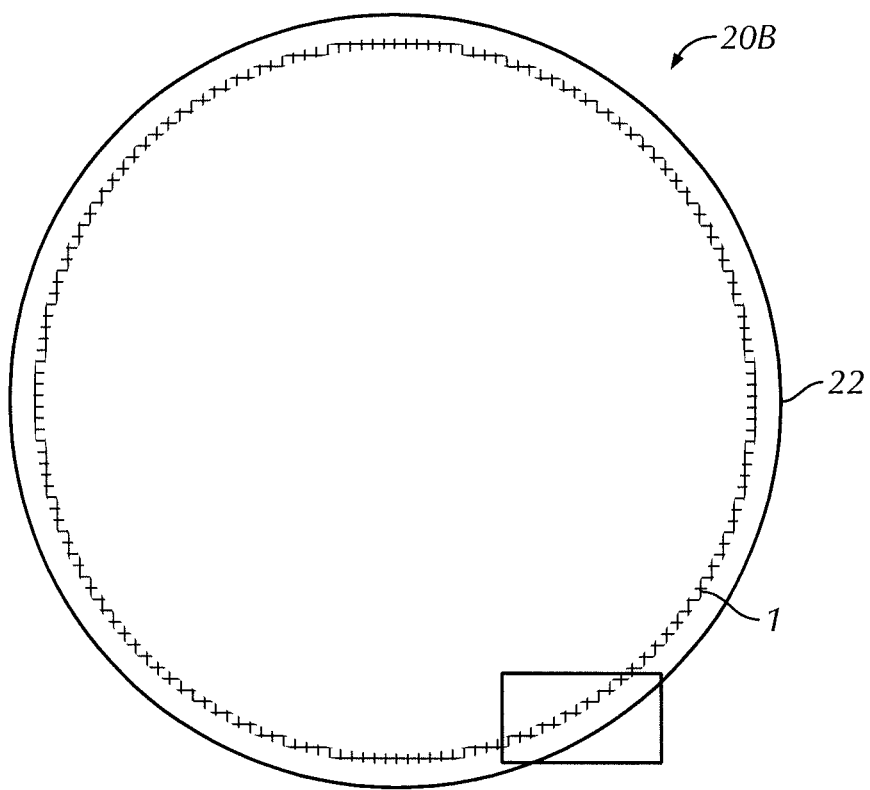
FIG. 8(a) illustrates a configuration of a wafer level package according to yet another modification and is a plan view illustrating the configuration of the wafer.
Figure 8B:
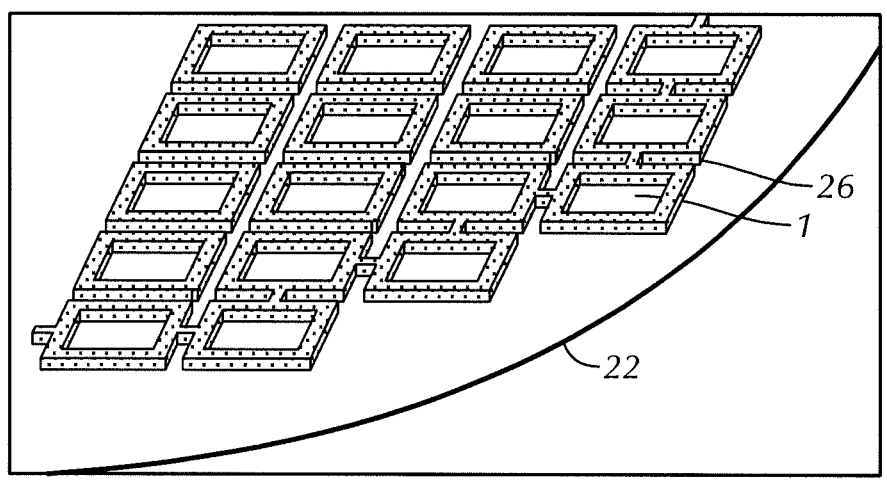
FIG. 8(b) illustrates a square portion in FIG. 8(a) and is a perspective view illustrating the configuration of the main part of the wafer level package.
Figure 9:
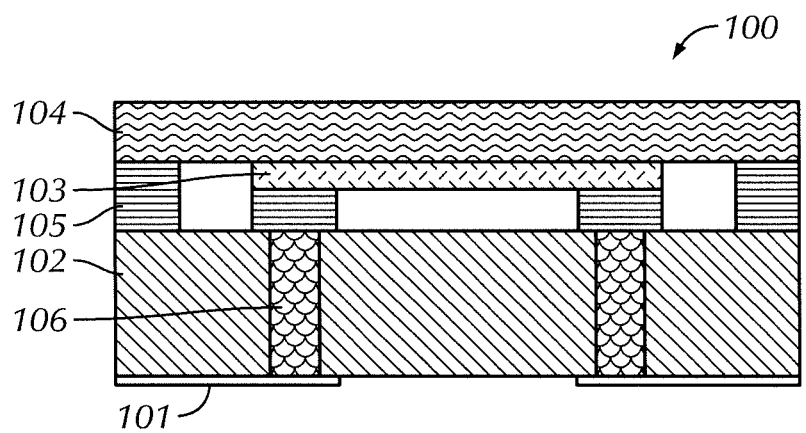
FIG. 9 is a sectional view illustrating a configuration of a conventional wafer level package.
Figure 10A:
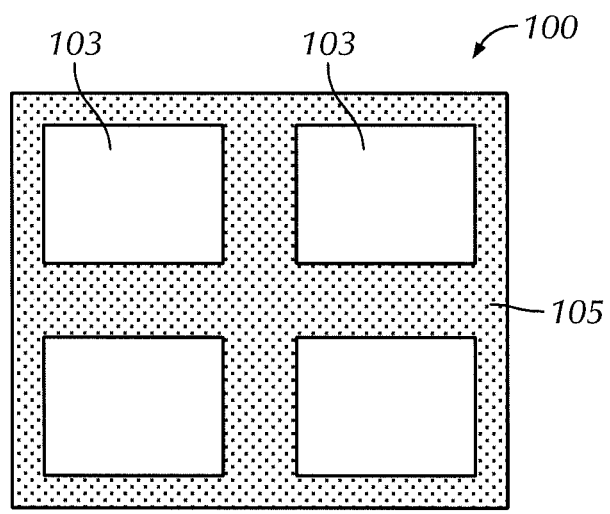
FIG. 10(a) is a plan view illustrating the configuration of the main part of the conventional wafer level package.
Figure 10B:
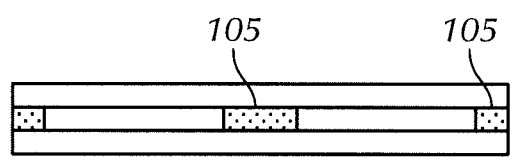
FIG. 10(b) is a front view illustrating the configuration of the main part of the wafer level package.

Alternatively, for example, as illustrated in FIGS. 8(a) and 8(b), the partial connect part 26 may be provided in the gap 24 only of the seal frame 4 of the semiconductor chip 1 that is mounted on or formed in the outermost circumference of the base wafer 22 in the semiconductor chips 1, which are mounted on or formed in the plane of the base wafer 22 that is of the first wafer.

Therefore, the number of semiconductor chips 1 in which the dicing line 25 passes through the seal frame 4 can be minimized by minimizing the number of partial connect parts 26, and the generation of the crack can further be reduced in the seal frame 4.

It is conceivable that there is no meaning to form the partial connect part 26 of the seal frame 4 only in the outer circumferential portions OUTER of the base wafer 22 and the cover wafer 23. However, in the case that the partial connect part 26 is provided only in the gap 24 in the seal frame 4 of the semiconductor chip 1 that is mounted on or formed in the outermost circumference of the base wafer 22, there is the risk of destroying the sealing property due to the crack generated in the seal frame 4 during the dicing.

On the other hand, when the partial connect part 26 of the seal frame 4 is formed only in the outer circumferential portions OUTER of the base wafer 22 and the cover wafer 23, the sealing property in the central portion INNER of the wafer is not destroyed even if the crack is generated in the seal frame 4 during the dicing.

As described above, in the wafer level package according to one or more embodiments of the present invention, the plural chips are arrayed while mounted on or formed in the plane of the first wafer and the partial connect part is provided in the center portion on the opposed side of the seal frames opposed to each other.

Generally, in the device in which different materials are stacked, the stress is generated by the difference in thermal expansion coefficient during the temperature change. The stress increases with distance from the center of the device. Therefore, in the case that the partial connect part is located closest to the center of the device, namely, in the case that the plural chips are arrayed while mounted on or formed in the plane of the first wafer, the partial connect part is disposed in the center portion in each of the x-direction and the y-direction of the seal frame, thereby obtaining the best environment resistance.

On this point, in one or more embodiments of the present invention, the partial connect part is provided at the position where the thermal stress is minimized during the thermal expansion because the partial connect part is provided in the center portion on the opposed sides of the seal frames opposed to each other. Accordingly, the possibility that the partial connect part is destroyed becomes the minimum during the thermal expansion.

In one or more embodiments of the present invention, the partial connect part is provided in the center portion on the opposed sides of the seal frames opposed to each other, thereby locally equalizing the area ratio of the seal frame in the plane of the wafer. Accordingly, in the case that the seal frame is patterned using the resist mold and formed by the electrolytic plating, the electric flux density is equalized during the electrolytic plating when the partial connect part is formed in the center portion on the opposed sides of the seal frames by the electrolytic plating. As a result, the plating deposition rate is equalized in the plane of the wafer, and the variation in plating thickness decreases to be able to stabilize the run-around of the sealing material between the joined surfaces.

In the wafer level package of one or more embodiments of the present invention, the width of the partial connect part is equalized to the width of the seal frame.

In the case that the joined surfaces of the first wafer and the second wafer, particularly the joined surfaces of the seal frame and the first wafer and/or the second wafer are bonded using the bonding agent, the bonding agent moves to the wider pattern width by the influence of the surface tension when the bonding agent spreads onto the joined surface while the partial connect part differs from the seal frame in the pattern width.

On this point, in one or more embodiments of the present invention, the width of the partial connect part is equal to the width of the seal frame, so that the first wafer and the second wafer can be joined while the bonding agent spreads stably to both the partial connect part and the seal frame.

In the case that the seal frame is formed by the mold plating, the width of the partial connect part is equalized to the width of the seal frame to equalize the plating deposition rate in the plane. As a result, the variation in plating thickness decreases to be able to stabilize the run-around of the sealing material between the joined surfaces.

In the wafer level package of one or more embodiments of the present invention, the width of the partial connect part is greater than or equal to 1 µm.

The one partial connect part is provided in the side surface of each seal frame, and the width of the partial connect part is narrowed as much as possible within the range where the partial connect part can stably be joined. Therefore, the length of the joined portion to be diced can further be shortened. Therefore, the crack, which is generated in the joined portion during the dicing, can be reduced to the minimum to ensure the high reliability. From this viewpoint, according to one or more embodiments of the present invention, the minimum value of the width of the partial connect part is greater than or equal to 1 µm in consideration of the partial connect part that can be formed by the etching and the restriction to the alignment accuracy during the joining.

In the wafer level package of one or more embodiments of the present invention, the partial connect part can be provided in the gap only of the seal frame of the chip that is mounted on or formed in the outer circumferential portion of the first wafer in the chips that are mounted on or formed in the plane of the first wafer. As used herein, the outer circumferential portion of the first wafer specifically means the seal frames that are formed in the peripheries of at least the top third chips from the outermost circumference of the first wafer in both the x-direction and the y-direction.

Therefore, when the partial connect part of the seal frame is formed only in the outer circumferential portions of the first wafer and the second wafer, the partial connect part that traverses the dicing line does not exist in the seal frame in the central portions of the first wafer and the second wafer. Accordingly, the generation of the crack can be reduced in the seal frame.

In the wafer level package of one or more embodiments of the present invention, the partial connect part can be provided in the gap only of the seal frame of the chip that is mounted on or formed in the outermost circumference of the first wafer in the chips that are mounted on or formed in the plane of the first wafer.

Therefore, the number of chips in which the dicing line passes through the seal frame can be minimized by minimizing the number of partial connect parts, and the generation of the crack can further be reduced in the seal frame.

The present invention is not limited to the above embodiments, but various changes can be made without departing from the scope of the present invention. It is noted that an embodiment obtained by properly combining technical means disclosed in different embodiments is also included in the technical scope of the present invention.

One or more embodiments of the present invention can be applied to the wafer level package that is applied to the semiconductor package mounted on the electronic products typified by the mobile phone, the mobile computer, the personal digital assistance (PDA), and the digital still camera (DSC), the chip size package device such as the MEMS (Micro Electro Mechanical Systems) device, and the wafer level package manufacturing method.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS 1 semiconductor chip (chip)
2 base
3 cover
4 seal frame
5 bonding agent
10 chip size package device
20A wafer level package
20B wafer level package
22 base wafer (first wafer)
23 cover wafer (second wafer)
24 gap
25 dicing line
26 partial connect part
C pattern width (width of partial connect part)
INNER central portion
OUTER outer circumferential portion
S pattern width (width of seal frame)

The invention claimed is:

1. A wafer level package comprising:
a first wafer comprising a plurality of chips mounted or formed thereon in a plane; and
a second wafer that is opposed to the first wafer,
wherein the first wafer and the second wafer are joined while a plurality of partially connected seal frames that seal a periphery of each chip is interposed therebetween,
wherein a gap is formed between the seal frames of the chips adjacent to each other, and
wherein a partial connect part that partially connects the seal frames to each other is provided in the gap formed between the seal frames of the chips adjacent to each other.

2. The wafer level package according to claim 1, wherein the plurality of chips are arrayed while mounted on or formed in the plane of the first wafer, and
wherein the partial connect part is provided in opposed-side center portions of the seal frames opposed to each other.

3. The wafer level package according to claim 2, wherein a width of the partial connect part is equal to a width of the seal frame.

4. The wafer level package according to claim 1, wherein the width of the partial connect part is greater than or equal to 1 µm.

5. The wafer level package according to claim 1, wherein the partial connect part is provided in the gap only of the seal frame in each chip mounted on or formed in an outer circumferential portion of the first wafer in the chips mounted on or formed in the plane of the first wafer.

6. The wafer level package according to claim 1, wherein the partial connect part is provided in the gap only of the seal frame in each chip mounted on or formed in an outermost circumference of the first wafer in the chips mounted on or formed in the plane of the first wafer.

7. A chip size package device into which a wafer level package is individualized, comprising:
a first wafer comprising a plurality of chips mounted or formed thereon in a plane; and
a second wafer opposed to the first wafer,
wherein the first wafer and the second wafer are joined while a plurality of partially connected seal frames that seal a periphery of each chip is interposed between the first wafer and the second wafer,
wherein a gap is formed between the seal frames of the chips adjacent to each other, wherein a partial connect part that partially connects the seal frames to each other is provided in the gap formed between the seal frames of the chips adjacent to each other, and the chip is individualized by dicing the gap and the partial connect part, after the first wafer and second wafer are joined while the frame-like seal frame that seals a periphery of each chip is interposed therebetween.

8. A wafer level package manufacturing method for individualizing the wafer level package, wherein the wafer level package comprises:

a first wafer comprising a plurality of chips mounted or formed thereon in a plane; and a second wafer opposed to the first wafer, wherein the first wafer and the second wafer are joined while a plurality of partially connected seal frames that seal a periphery of each chip is interposed between the first wafer and the second wafer, and wherein the wafer level package manufacturing method comprises:

forming a gap between the seal frames of the chips adjacent to each other, forming the seal frame such that a partial connect part that partially connects the seal frames to each other is provided in the gap formed between the seal frames of the chips adjacent to each other, and individualizing the chips by dicing the gap and the partial connect part, after the first wafer and second wafer are joined while the frame-like seal frame that seals a periphery of each chip is interposed therebetween.

9. The wafer level package according to claim 2, wherein the width of the partial connect part is greater than or equal to 1 μm.

10. The wafer level package according to claim 3, wherein the width of the partial connect part is greater than or equal to 1 μm.

11. The wafer level package according to claim 2, wherein the partial connect part is provided in the gap only of the seal frame in each chip mounted on or formed in an outer circumferential portion of the first wafer in the chips mounted on or formed in the plane of the first wafer.

12. The wafer level package according to claim 3, wherein the partial connect part is provided in the gap only of the seal frame in each chip mounted on or formed in an outer circumferential portion of the first wafer in the chips mounted on or formed in the plane of the first wafer.

13. The wafer level package according to claim 4, wherein the partial connect part is provided in the gap only of the seal frame in each chip mounted on or formed in an outer circumferential portion of the first wafer in the chips mounted on or formed in the plane of the first wafer.

14. The wafer level package according to claim 9, wherein the partial connect part is provided in the gap only of the seal frame in each chip mounted on or formed in an outer circumferential portion of the first wafer in the chips mounted on or formed in the plane of the first wafer.

15. The wafer level package according to claim 10, wherein the partial connect part is provided in the gap only of the seal frame in each chip mounted on or formed in an outer circumferential portion of the first wafer in the chips mounted on or formed in the plane of the first wafer.

16. The wafer level package according to claim 2, wherein the partial connect part is provided in the gap only of the seal frame in each chip mounted on or formed in an outermost circumference of the first wafer in the chips mounted on or formed in the plane of the first wafer.

17. The wafer level package according to claim 3, wherein the partial connect part is provided in the gap only of the seal frame in each chip mounted on or formed in an outermost circumference of the first wafer in the chips mounted on or formed in the plane of the first wafer.

18. The wafer level package according to claim 4, wherein the partial connect part is provided in the gap only of the seal frame in each chip mounted on or formed in an outermost circumference of the first wafer in the chips mounted on or formed in the plane of the first wafer.

19. The wafer level package according to claim 5, wherein the partial connect part is provided in the gap only of the seal frame in each chip mounted on or formed in an outermost circumference of the first wafer in the chips mounted on or formed in the plane of the first wafer.

20. The wafer level package according to claim 9, wherein the partial connect part is provided in the gap only of the seal frame in each chip mounted on or formed in an outermost circumference of the first wafer in the chips mounted on or formed in the plane of the first wafer.

* * * * *